(12) United States Patent
Lien et al.

(10) Patent No.: US 6,307,399 B1
(45) Date of Patent: Oct. 23, 2001

(54) HIGH SPEED BUFFER CIRCUIT WITH IMPROVED NOISE IMMUNITY

(75) Inventors: Chuen-Der Lien, Los Altos Hills; Ta-Ke Tien, Cupertino, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/089,309

(22) Filed: Jun. 2, 1998

(51) Int. Cl.[7] .................. H03K 19/0175; H03K 19/003; H03K 19/094
(52) U.S. Cl. ............................... 326/83; 326/27; 326/119
(58) Field of Search ................................ 326/83, 86, 17, 326/26, 27, 112, 119, 121; 327/391, 387, 384, 389

(56) References Cited

U.S. PATENT DOCUMENTS

| | | | |
|---|---|---|---|
| 4,701,646 | * 10/1987 | Richardson | 326/117 |
| 4,933,574 | 6/1990 | Lien | 326/84 |
| 5,008,568 | 4/1991 | Leung | 326/27 |
| 5,117,131 | * 5/1992 | Ochi et al. | 326/71 |
| 5,122,690 | * 6/1992 | Bianchi | 326/27 |
| 5,237,213 | * 8/1993 | Tanoi | 327/205 |
| 5,319,258 | * 6/1994 | Ruetz | 326/21 |
| 5,376,846 | * 12/1994 | Houston | 327/513 |
| 5,467,031 | 11/1995 | Nguyen | 326/81 |
| 5,510,728 | 4/1996 | Huang | 326/30 |
| 5,517,142 | * 5/1996 | Jang et al. | 327/108 |
| 5,581,105 | 12/1996 | Huang | 257/369 |
| 5,828,235 | * 10/1998 | Horiguchi et al. | 326/121 |
| 5,852,540 | * 12/1998 | Haider | 361/111 |
| 5,894,238 | * 4/1999 | Chien | 327/112 |

* cited by examiner

*Primary Examiner*—Michael Tokar
*Assistant Examiner*—James H Cho
(74) *Attorney, Agent, or Firm*—Skjerven Morrill MacPherson, LLP (57) ABSTRACT

In a buffer circuit a pull-up circuit causes an output terminal of the buffer circuit make a transition from a low voltage to a high, and a feedback circuit increases the rate of the transition during the part of the transition when the output terminal moves from the low voltage to a predesignated voltage, the predesignated voltage being a value between but different from the low and high voltages. In another buffer circuit powered by a power supply voltage, a pull-up transistor causes a signal at an output terminal of the buffer circuit make a transition from a low voltage to a high voltage, and a converter circuit converts the power supply voltage to a lower voltage, the lower voltage powering the pull-up transistor.

17 Claims, 8 Drawing Sheets

HIGH SPEED BUFFER CIRCUIT WITH IMPROVED NOISE IMMUNITY

BACKGROUND

1. Field of the Invention

The present invention relates to buffer circuits and more particularly to an output buffer circuit with improved noise immunity and speed.

2. Description of Related Art

Figure 1A:
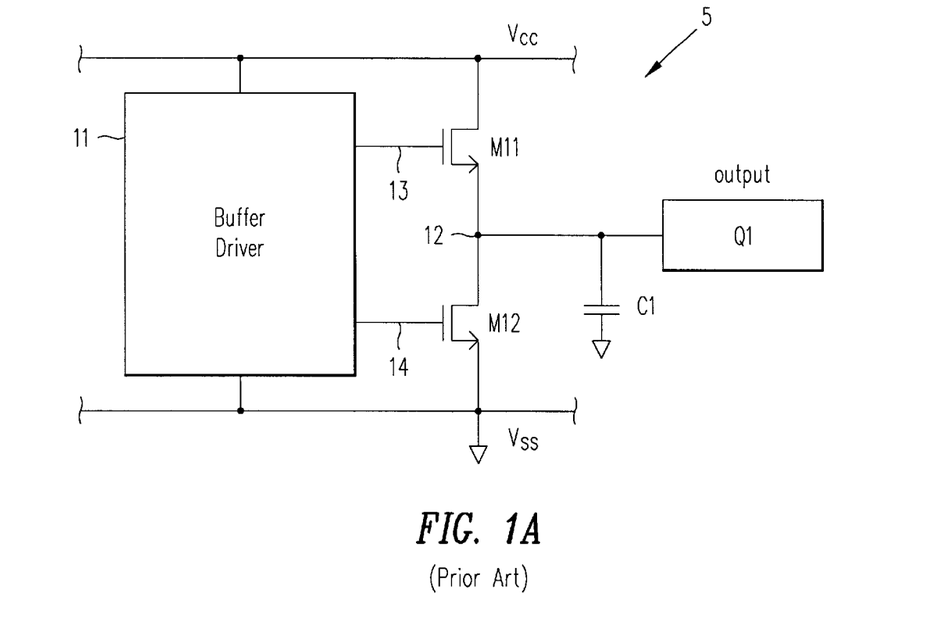
FIG. 1A is a prior art output buffer circuit wherein both the pull-up and pull-down transistors used in driving the output terminal Q1 are NMOS transistors.
Figure 1B:
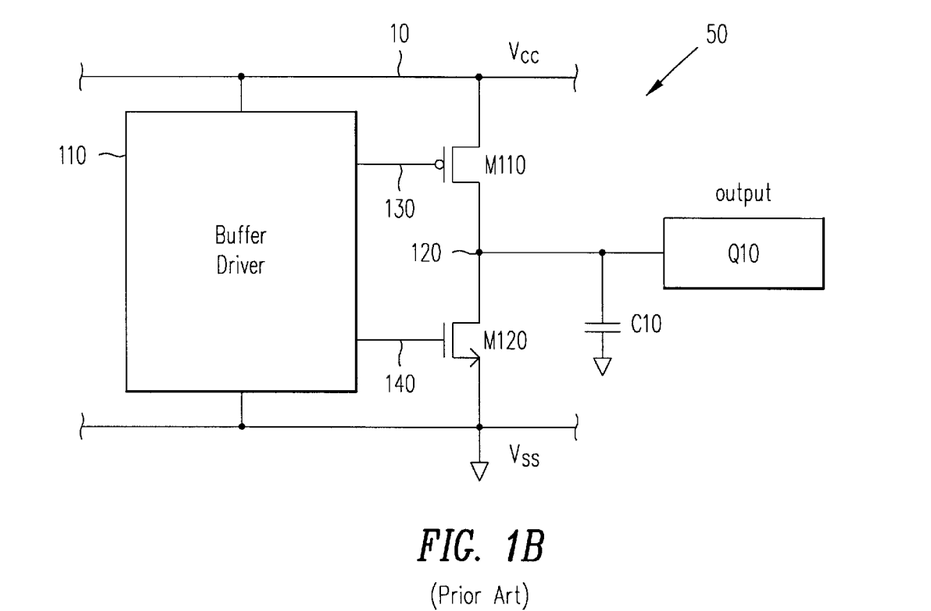
FIG. 1B is a prior art output buffer circuit wherein a PMOS pull-up transistor and an NMOS pull-down transistor are used in driving the output terminal Q10.

FIGS. 1A and 1B show two prior art output buffer circuits. FIG. 1A shows an output buffer circuit 5 wherein both the pull-up transistor M11 and the pull-down transistor M12 are NMOS transistors. M11 has its drain connected to the power supply Vcc, its gate connected to lead 13 and its source connected to node 12. M12 has its drain connected to node 12, its gate connected to lead 14 and its source connected to the ground Vss. The source of M11 and the drain of M12 are connected to the output terminal Q1 of circuit 5. Capacitor C1 at the output terminal Q1 represents the output load which the buffer circuit 5 drives.

To drive the output terminal Q1 high, the buffer driver circuit 11 causes lead 13 to go high (i.e., Vcc) thereby turning on M11, and causes lead 14 to go low (i.e., Vss) thereby turning off M12. With the drain and gate of M11 at Vcc, output terminal Q1 is raised to Vcc minus a threshold voltage (VT). Assuming Vcc to be 5 V and the threshold voltage of M11 to be 1 V, the output terminal Q1 reaches a high voltage level of 4 V.

To drive the output terminal Q1 low, the buffer driver circuit 11 causes lead 13 to go low thereby turning off M11, and lead 14 to go high thereby turning on M12.

One advantage of circuit 5 is that because the high voltage level on output terminal Q1 is Vcc minus VT (or 4 V), the high to low transition on the output terminal Q1 is faster as compared to the case wherein the output terminal is driven to full Vcc (or 5 V). Further, the amount of charge discharged into Vss during the high to low transition is lower. This in turn reduces the amount of noise generated on Vss. In devices with multiple output buffer circuits wherein multiple output capacitances can be discharged to Vss at the same time, the cumulative effect of the reduction in the amount of charge discharged into Vss is a significant noise reduction on Vss.

One disadvantage of circuit 5 is slow low to high transition at the output terminal Q1. Initially, when the output terminal Q1 starts to rise, M11 has 5V across both its gate to source and drain to source. However, as the output terminal Q1 rises, the voltage across both the gate to source and drain to source reduce, causing M11 to rapidly become weak. Thus, the output terminal Q1 rises slowly after an initial brief rapid rise.

Circuit 50 in FIG. 1B is identical to circuit 5 in FIG. 1A except that a PMOS transistor M110 is used as the pull-up transistor. To pull the output terminal Q10 high, the gates of transistors M110 and M120 at the respective leads 130 and 140 are pulled low (to 0 V). Since M110 is a PMOS transistor, with 0 V at its gate, the output terminal Q10 is pulled up to the full Vcc level. To pull the output terminal Q10 low, the gates of M110 and M120 are pulled high.

The advantage of circuit 50 is that the low to high transition at the output terminal Q10 is fast. This is because the PMOS transistor M110 has −5 V across its gate to source throughout the transition. However, this circuit suffers from the following two disadvantages: 1) a high to low transition is slower since the transition is made from full Vcc as opposed to Vcc minus VT, and 2) more noise is generated on Vss since a greater amount of charge is discharged into Vss during the high to low transition.

Accordingly, there is a need for an output buffer circuit providing fast output transitions with low ground noise.

SUMMARY

In accordance with a first embodiment of the present invention, a buffer circuit includes a first circuit for causing an output terminal of the buffer circuit to make a transition from a first voltage to a second voltage. The buffer circuit also includes a feedback circuit for increasing the rate of the transition during the part of the transition when the output terminal moves from the first voltage to a predesignated voltage, the predesignated voltage being a value between but different from the first and second voltages.

In an alternate embodiment of the first embodiment, the feedback circuit is turned off when the output terminal reaches the predesignated voltage. The buffer circuit is powered by a power supply voltage provided at a power supply terminal. The first circuit includes an NMOS transistor connected between the power supply terminal and the output terminal. The feedback circuit includes a PMOS transistor and a logic gate, the logic gate having an input terminal and an output terminal. The PMOS transistor is connected between the power supply terminal and the output terminal of the buffer circuit. The input terminal of the logic gate is connected to the output terminal of the buffer circuit, and the output terminal of the logic gate is connected to the gate of the PMOS transistor. As the output terminal makes a transition from a low voltage to the predesignated voltage, the logic gate causes the PMOS transistor to turn on when the output terminal starts to rise, and then causes the PMOS transistor to turn off when the output terminal reaches the predesignated voltage. In this manner, both the PMOS and NMOS transistors are on simultaneously, pulling the output signal to the predesignated voltage at a faster rate than if only the NMOS transistor was on. Also, with the PMOS transistor turned off after the output terminal reaches the predesignated voltage, the NMOS transistor prevents the output signal from reaching the full supply voltage level. The lower output voltage level helps increase the output high to low transition rate, as well as reduce the amount of noise generated on the ground terminal as a result of the output high to low transition.

In accordance with a second embodiment of the present invention, a buffer circuit is powered by a power supply voltage. The buffer circuit includes an output terminal and a pull-up transistor for causing a signal at the output terminal to make a transition from a low voltage to a high voltage. The buffer circuit also has a converter circuit for converting the power supply voltage to a first voltage, the first voltage being lower than the power supply voltage. The first voltage powers the pull-up transistor.

In an alternate embodiment of the second embodiment, not intended to be limiting, the time delay through the buffer circuit is measured relative to the time at which the signal at the output terminal reaches a predesignated voltage. The predesignated voltage is intermediate the high voltage and the low voltage. In this alternate embodiment, the pull up transistor is a PMOS transistor with its drain connected to the output terminal of the buffer circuit and its source connected to the first voltage. Accordingly, in a low to high output transition, the PMOS transistor causes the output terminal to reach the predesignated voltage at a faster rate than if an NMOS transistor was used. Also, a fast high to low output transition, as well as reduced ground noise, are achieved because the converter circuit limits the output high voltage level to a level lower than the supply voltage.

These and other features and advantages of the present invention will become more apparent from the following description and the accompanying drawings.

DESCRIPTION OF PREFERRED EMBODIMENTS

Figure 2:
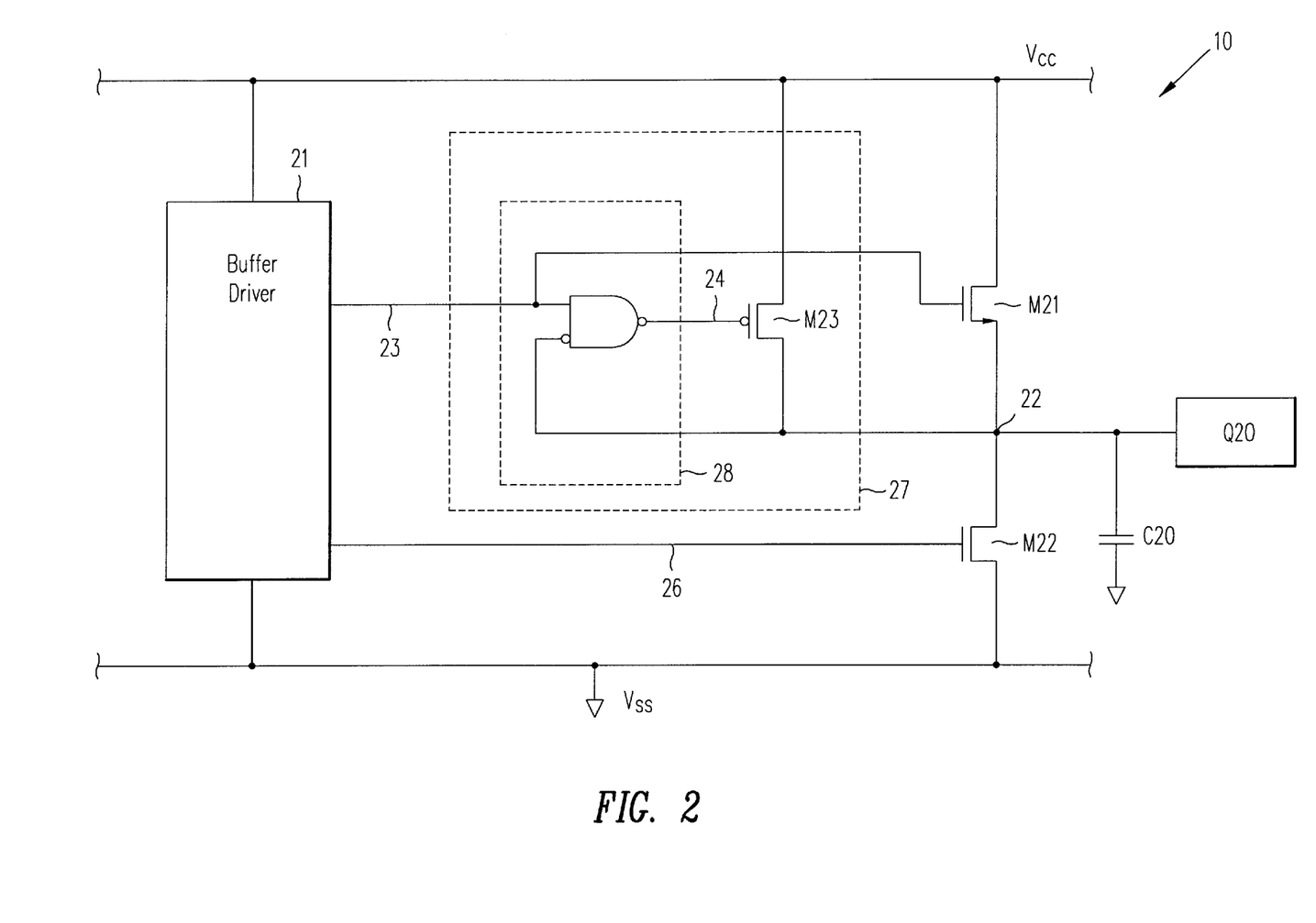
FIG. 2 is an output buffer circuit in accordance with one embodiment of the present invention wherein, similar to circuit 5 of FIG. 1A, both the pull-up and pull-down transistors used in driving the output terminal Q20 are NMOS transistors, but a feedback circuit 27 is incorporated to improve output rise time.

Circuit 25 in FIG. 2 is one embodiment of the present invention. Circuit 25 includes all the elements of prior art circuit 5 (FIG. 1A) plus the feedback circuit 27. Feedback circuit 27 comprises a logic gate 28 and a PMOS transistor M23. Logic gate 28 is a two input NAND gate having an inverted input. The inverted input is connected to the output terminal Q20 (at node 22), and the non-inverted input of logic gate 28 is connected to the buffer driver 21 at lead 23. The output terminal of logic gate 28 is connected to the gate of transistor M23 at lead 24. The PMOS transistor M23 has its source connected to Vcc, its gate connected to lead 24 and its drain connected to the output terminal Q20. NMOS transistor M21 has its drain connected to Vcc, its gate connected to the buffer driver 21 at lead 23, and its source connected to the output terminal Q20. NMOS transistor M22 has its drain connected to the output terminal Q20, its gate connected to the buffer driver 21 at lead 26, and its source connected to ground Vss.

Similar to circuit 5 in FIG. 1A, the high level at the output terminal Q20 is Vcc minus VT. Consequently, the high to low transition is fast and the ground noise is low. Further, in contrast to circuit 5 of FIG. 1A, the low to high transition is also fast due to feedback circuit 27.

Figure 3:
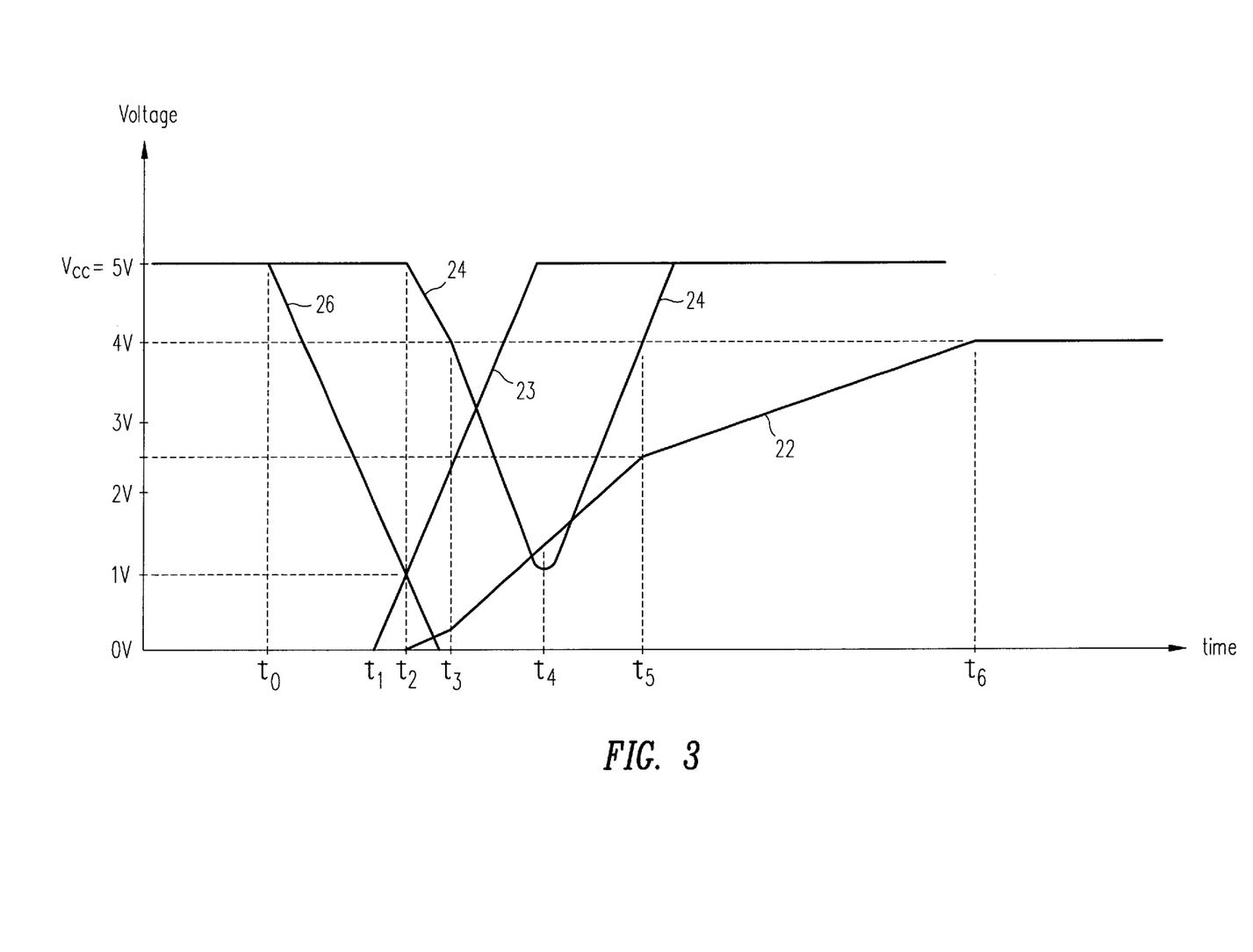
FIG. 3 is a timing diagram used to illustrate the operation of circuit 25 in FIG. 2.

FIG. 3 shows the waveforms at different nodes of circuit 25 for a low to high transition on the output terminal. In FIG. 3, the horizontal axis represents time, and the vertical axis represents voltage. The voltage levels and the ramp rates shown in FIG. 3 are selected solely for the purpose of illustration and are not intended to be limiting. The waveforms labeled 22, 23, 24 and 26 represent the waveforms at leads 22, 23, 24 and 26, respectively.

At time $t_0$ the voltage at lead 26 starts to fall from Vcc (5 V) to Vss (0 V), and at a later time $t_1$ the voltage at lead 23 starts to rise from 0 V to 5 V. The waveforms 23, 24 and 26 are timed so that no crow-bar current flows from Vcc to Vss through M21, M22, and M23 (i.e., M21 and M23 are never on at the same time as M22.) Assuming the threshold voltage of all NMOS transistors is 1 V, M22 turns off at time $t_2$ when waveform 26 drops below 1 V. M21 turns on at about the same time $t_2$ or later, when waveform 23 rises above 1 V. The PMOS transistor M23 turns on when its gate to source voltage exceeds its threshold voltage. Assuming the threshold voltage of PMOS transistor M23 is −1 V, M23 turns on at a still later time $t_3$ when its gate voltage drops below 4 V.

The output terminal Q20 (waveform 22) starts to rise when M21 turns on at time $t_2$. The low to high transition at lead 23 causes the voltage at lead 24 to go low. This is because at the time waveform 23 makes a low to high transition, the input of logic gate 28 connected to the output terminal Q20 is still low. At time $t_3$, waveform 24 drops below 4 V turning on M23. This causes the voltage at the output terminal Q20 to rise at a faster rate since both M21 and M23 are on and act as two pull-up transistors operating in parallel. Thus, a faster rise time is achieved at the output terminal Q20 as compared to the prior art circuit of FIG. 1A. Note that the feedback circuit 27 can be designed so that M23 turns on quite early, i.e., $t_3$ can be very close to $t_2$.

If M23 were to remain on indefinitely, it would pull the output terminal Q20 to full Vcc. To prevent the output terminal Q20 from reaching full Vcc, M23 is turned off once the output terminal Q20 reaches a predesignated voltage. The predesignated voltage is typically the voltage at which the output terminal is considered to have switched from a low to a high level. For example, in the case of TTL levels wherein a TTL low level is 0.8 V and a TTL high level is 2.0 V, the mid-voltage level, i.e., 1.4 V, is the voltage at which a low to high or a high to low transition is accomplished. Therefore, in the case of TTL levels, M23 is turned off once the output terminal Q20 reaches 1.4 V.

In FIG. 3, the predesignated voltage is 2.5 V. As the output terminal Q20 approaches 2.5 V, logic gate 28 causes lead 24 to start rising. Logic gate 28 is designed so that lead 24 reaches 4 V (the voltage at which M23 turns off) at a time $t_5$ when the output terminal Q20 has reached 2.5 V. This is accomplished by properly ratioing the transistors which make up the logic gate 28, using techniques known in the art.

At time $t_5$, the ramp rate at the output terminal Q20 is slowed down since M23 is no longer on. At time $t_6$, the output terminal Q20 reaches a high level of only 4 V since M23 is turned off.

The timing of the high to low transition at the output terminal Q20 is similar to that of circuit 5 in FIG. 1A, and is not discussed herein. Suffice it to state that the feedback circuit 27 is designed so that no crow-bar current is consumed by M21, M22, and M23 during the output transition.

FIGS. 4A–4F exemplify different circuit implementations of the logic gate 28. The FIG. 4A implementation comprises a two input NAND gate 32 and an inverter 31. One input terminal of NAND gate 32 is connected to the buffer driver 21 (FIG. 2) via lead 23, and the other input terminal of NAND gate 32 is connected to the output terminal of inverter 31 at lead 30. The output terminal of NAND gate 32 is connected to the gate of M23 (FIG. 2) via lead 24. The input terminal of inverter 31 is connected to the output terminal Q20 (FIG. 2) via lead 22.

Figure 4A:
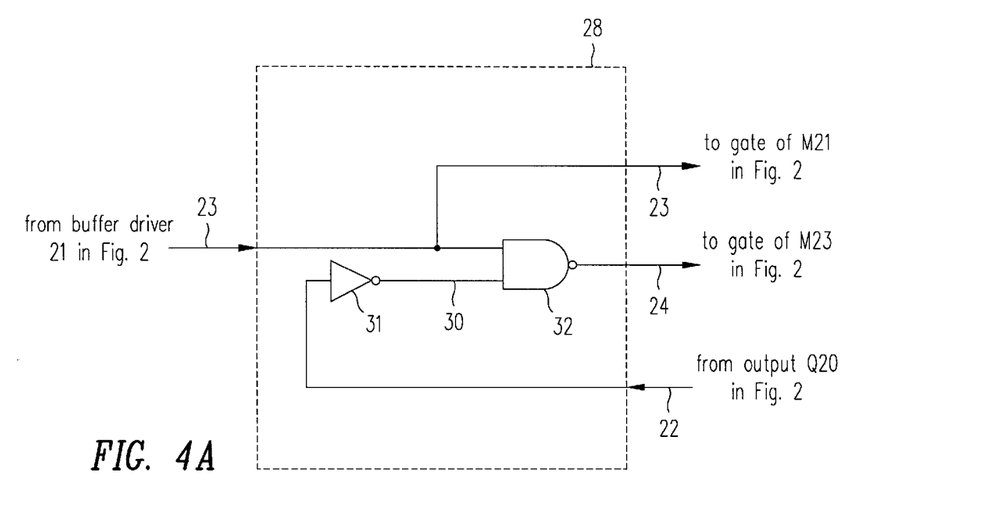
FIGS. 4A–4F exemplify different circuit implementations of the logic gate 28 in FIG. 2.
Figure 4B:
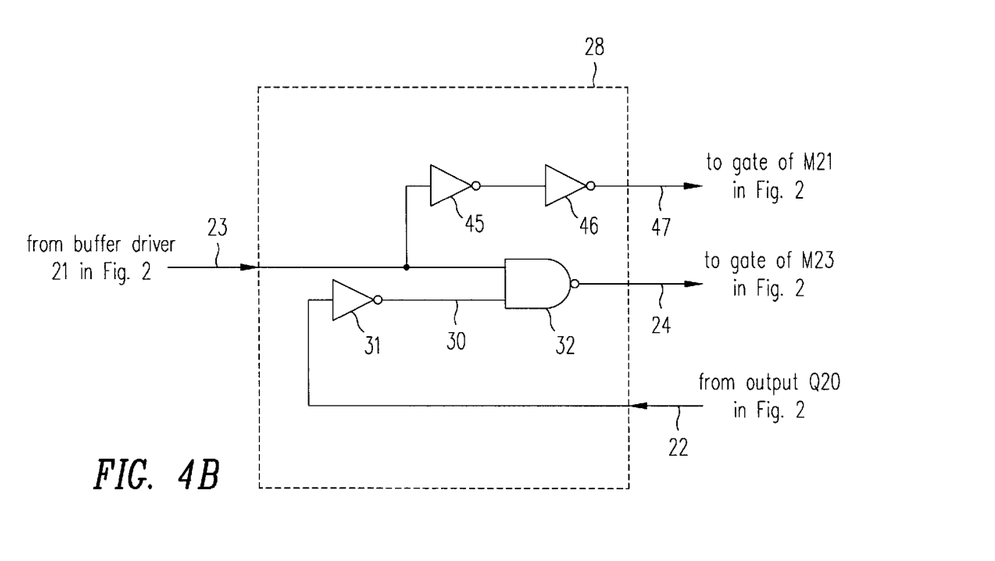

The FIG. 4B implementation is identical to FIG. 4A except that inverters 45 and 46 are inserted between lead 23 and the gate of M21 (FIG. 2). This embodiment is particularly useful where a high speed output buffer circuit 25 is needed to drive a large output capacitance C20. In such buffer circuits, large device sizes are selected for M21 and M22 to ensure high speed. The large device sizes result in large gate capacitances associated with M21 and M22. The large gate capacitances in turn result in slower transitions at leads 23 and 26 unless the gates of M21 and M22 are properly driven. One technique for rapidly driving the gate of M21, commonly referred to as buffering, is to drive the gate of M21 with a number of serially connected inverters, each inverter being greater in size than the inverter driving it. Inverters 45 and 46 in FIG. 4B perform such function.

Figure 4C:
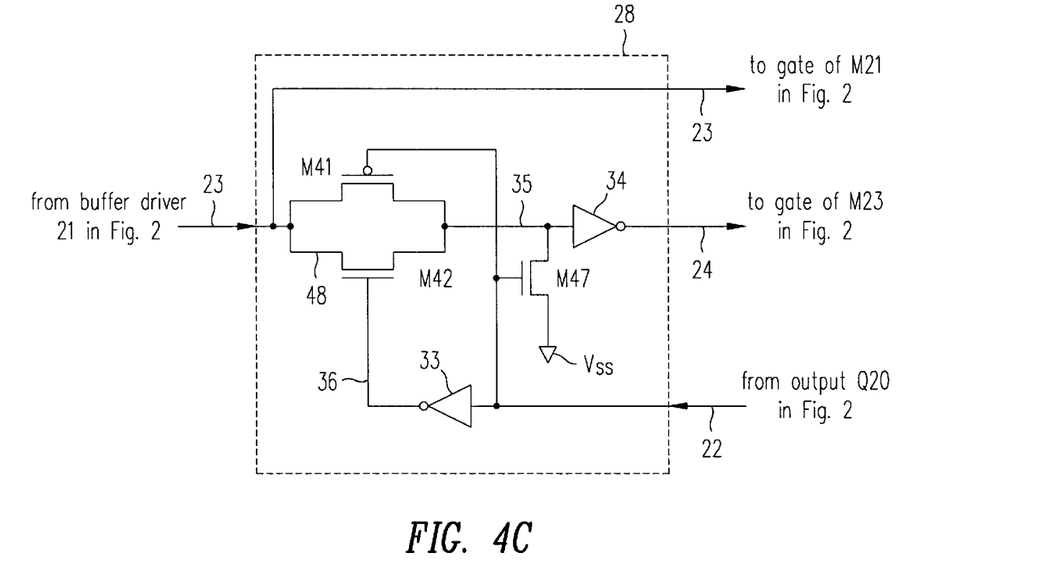

The FIG. 4C implementation comprises a CMOS transmission gate 48, two inverters 33 and 34, and a NMOS transistor 47. The CMOS transmission gate 48 comprises the PMOS transistor M41 and the NMOS transistor M42. The drains of M41 and M42 are connected to the buffer driver 21 (FIG. 2) via lead 23. The sources of M41 and M42 are connected to the input terminal of inverter 34 at lead 35. The output terminal of inverter 34 is connected to the gate of M23 (FIG. 2) via lead 24. The input terminal of inverter 33 and the gate of M41 are connected to the output terminal Q20 (FIG. 2) via lead 22. The output terminal of inverter 33 is connected to the gate of M42 at lead 36. M47 has its drain, source, and gate connected respectively to lead 35, Vss, and lead 22. M47 is a weak NMOS transistor which ensures that the output terminal Q20 does not reach full Vcc in a low to high transition. M47 does so by providing a leakage path from lead 35 to Vss when the transmission gate 48 is off. A low to high transition at the output terminal Q20 causes the transmission gate 48 to turn off and M47 to turn on. M47 then discharges the charge which would otherwise be trapped at lead 35.

Figure 4D:
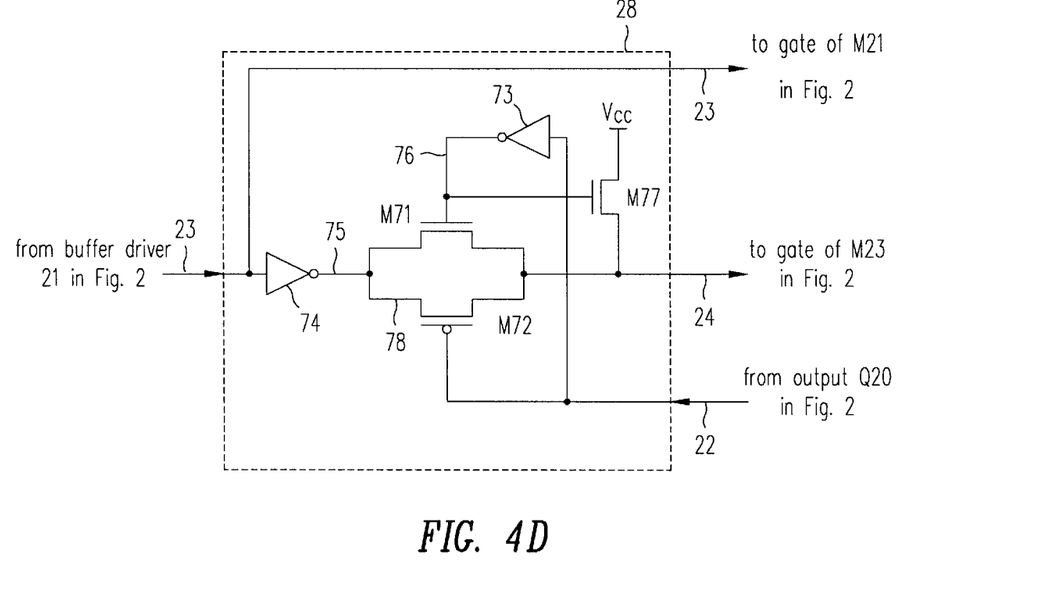

The FIG. 4D implementation is identical to the FIG. 4C implementation except that inverter 74 (which is equivalent to inverter 34 in FIG. 4C) is placed directly before the transmission gate 78, and a PMOS leaker transistor M77 is connected between Vcc and lead 24, replacing the NMOS leaker transistor M47 in FIG. 4B. Note that unlike M47 which has its gate connected to the input of inverter 33, M77 has its gate connected to the output of inverter 73. The operation of circuit of FIG. 4D is similar to that of FIG. 4C in that the leaker transistor M77 ensures that M23 in FIG. 2 turns off in time to prevent the output terminal from reaching full Vcc.

Figure 4E:
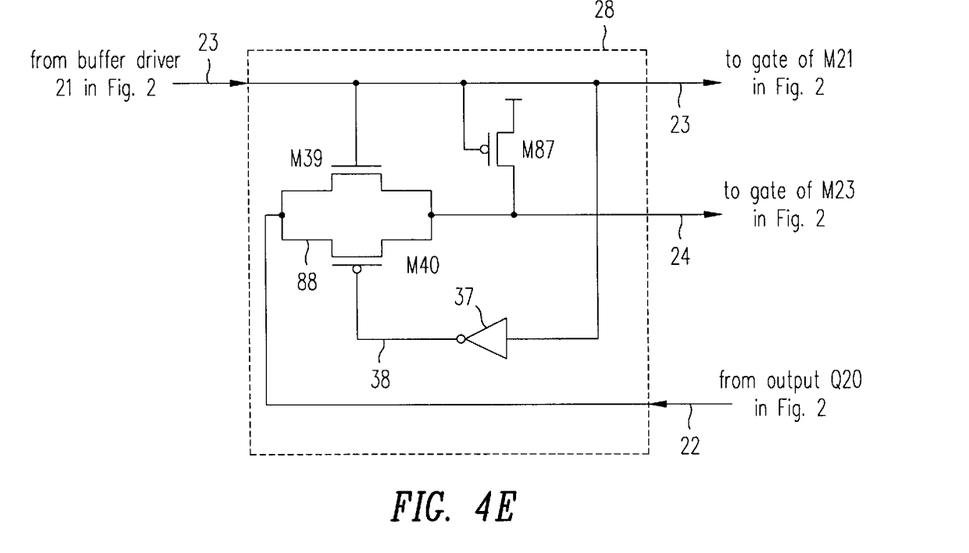

The FIG. 4E implementation comprises a CMOS transmission gate 88, an inverter 37, and a PMOS transistor M87. The transmission gate 88 comprises transistors M39 and M40. The drains of M39 and M40 are connected to the output terminal Q20 (FIG. 2) at lead 22, and the sources are connected to the gate of M23 (FIG. 2) at lead 24. The input terminal of inverter 37 and the gate of NMOS transistor M39 are connected to the buffer driver 21 (FIG. 2) at lead 23. The output terminal of inverter 37 is connected to the gate of PMOS transistor M40 at lead 38. The PMOS transistor M87 has its gate connected to lead 23, its source connected to Vcc, and its drain connected to lead 24. M87 is a weak transistor ensuring that M23 (FIG. 2) remains off when the transmission gate 88 is in the off state.

Figure 4F:
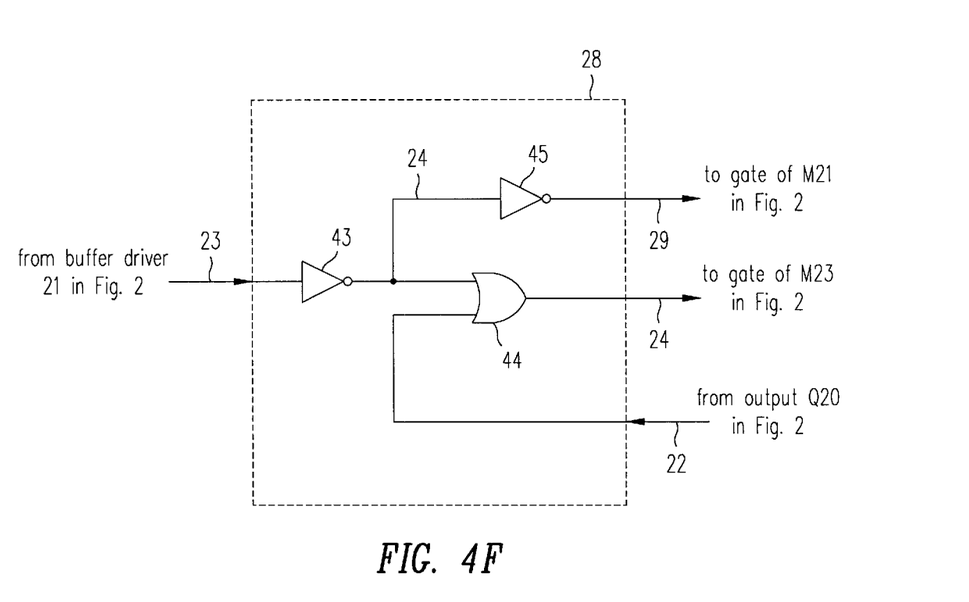

The FIG. 4F implementation comprises a two input OR gate 44 and two inverters 43 and 45. One input terminal of the OR gate 44 is connected to an output terminal of inverter 43 and an input terminal of inverter 45 at lead 24, and the other input terminal of the OR gate 44 is connected to the output terminal Q20 (FIG. 2) via lead 22. The output terminal of OR gate 44 is connected to the gate of M23 (FIG. 2) via lead 24. Inverter 43 has its input terminal connected to the buffer driver 21 (FIG. 2) via lead 23. Inverter 45 has its output terminal connected to the gate of M21 (FIG. 2) at lead 29. Similar to inverters 45 and 46 in FIG. 4B, inverters 43 and 45 also provide buffering for the gate of M21 (FIG. 2). Alternatively, if such buffering is not needed, inverter 45 may be removed, in which case lead 23 from buffer driver 21 (FIG. 2) needs to be connected to the gate of M21 (FIG. 2).

Depending on speed, power, area, and other considerations, one implementation from among the six represented by FIGS. 4A–4F may be preferred over the others.

Figure 5:
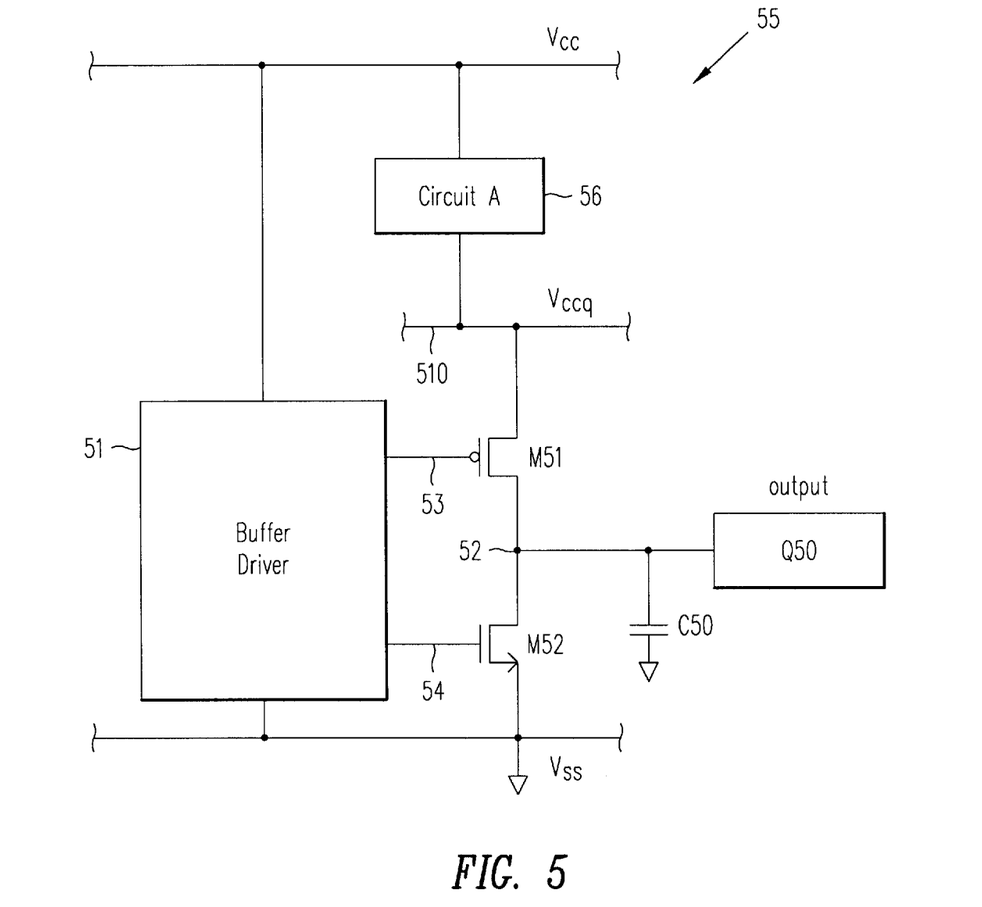
FIG. 5 is an output buffer circuit in accordance with a second embodiment of the present invention wherein, similar to circuit 50 of FIG. 1B, a PMOS pull-up transistor and an NMOS pull-down transistor are used in driving the output terminal Q50, but the supply voltage Vccq powering the PMOS transistor M51 is dropped relative to the supply voltage Vcc powering the entire circuit.

Circuit 55 in FIG. 5 is another embodiment of the present invention. Circuit block 56 is connected between the power supply terminal Vcc and the supply terminal Vccq at lead 510. PMOS transistor M51 has its source connected to Vccq, its gate connected to the buffer driver 51 at lead 53, and its drain connected to the output terminal Q50 at node 52. NMOS transistor M52 has its drain connected to the output terminal Q50 at node 52, its gate connected to the buffer driver 51 at lead 54, and its source connected to the ground terminal Vss. Capacitor C50 at the output terminal Q50 represents the output load that circuit 55 drives. Circuit 55 is identical to the prior art circuit 50 in FIG. 1B except that in circuit 55 the supply voltage Vccq providing power to M51 is lower than the supply voltage Vcc providing power to the rest of the circuit. Vccq is derived from Vcc via circuit block 56. By lowering the voltage provided to M51, the high voltage at the output terminal Q50 is lowered. As a result, a fast fall time and reduced ground noise are realized, while the advantage of a fast rise time associated with a PMOS pull-up transistor is preserved.

Figure 6A:
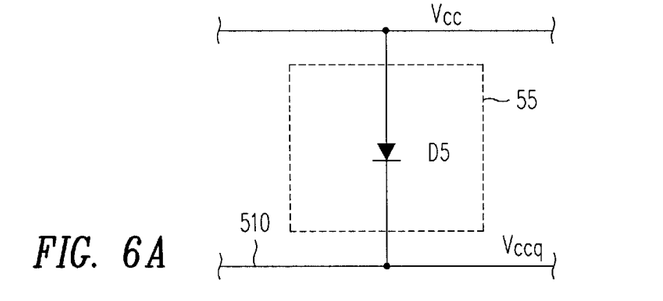
FIGS. 6A–6D exemplify different circuit implementations for the circuit block 56 in FIG. 5.
Figure 6B:
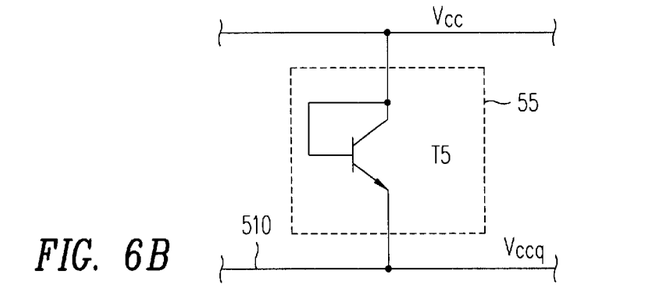
Figure 6C:
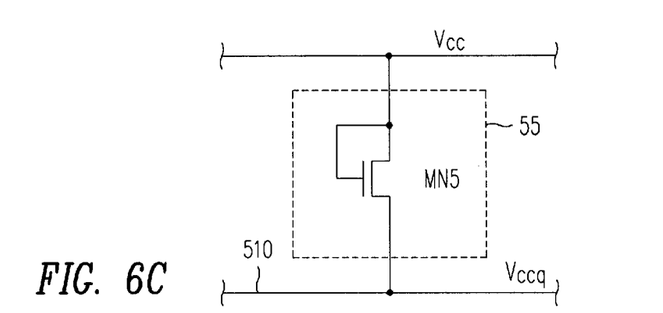
Figure 6D:
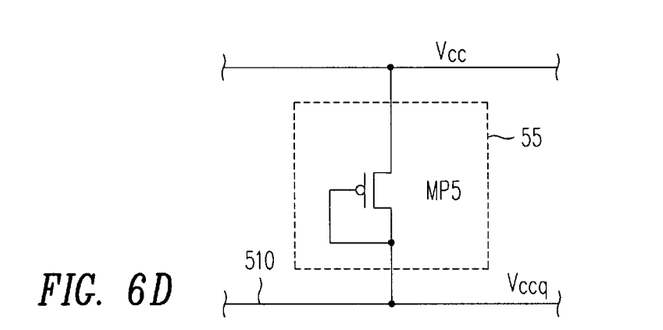

Circuit block 56 is designed to provide the output current sourcing requirements. Also, circuit 56 is typically designed to provide the equivalent of a threshold voltage (e.g., 1 V) drop. This can be accomplished by one of circuits shown in FIGS. 6A–6D. FIG. 6A shows a diode D5 having its anode terminal connected to Vcc and its cathode terminal connected to Vccq so that the Vccq voltage is below Vcc by a diode threshold voltage. FIGS. 6B–6D show different types of transistors, each connected in a diode formation between Vcc and Vccq, so that the same diode drop as in FIG. 6A is achieved. In FIG. 6B, an NPN bipolar transistor T5 has its base and collector connected to Vcc, and its emitter connected to Vccq. In FIG. 6C, an NMOS transistor MN5 has its gate and drain connected to Vcc, and its source connected to Vccq. In FIG. 6D, a PMOS transistor MP5 has its source connected to Vcc, and its gate and drain connected to Vccq. Proper sizes are selected for D5, T5, MN5, and MP5 to provide the current sourcing requirements as mentioned above.

The above description of the present invention is intended to be illustrative and not limiting. The invention is further intended to include all variations and modifications falling within the scope of the appended claims.

We claim:

1. A buffer circuit comprising:
    an output terminal;
    a first circuit coupled between a power supply terminal and a ground terminal for causing the output terminal to make a transition from a first voltage to a second voltage, the first circuit including a first NMOS transistor coupled between the power supply terminal and the output terminal and a second NMOS transistor coupled between the output terminal and the ground terminal; and a feedback circuit for increasing the rate of said transition during part of the transition when the output terminal moves from the first voltage to a predesignated voltage, the predesignated voltage being a value between but different from the first and second voltages, the feedback circuit including an AND gate having a first input terminal coupled to a buffer driver, a second input terminal coupled to the output terminal, and a control terminal coupled to a pull transistor, the pull transistor being coupled between one of the power supply terminal or the ground terminal and the output terminal, the pull transistor being a PMOS transistor.

2. The buffer circuit of claim 1 wherein the feedback circuit is turned off when the output terminal reaches the predesignated voltage.

3. The buffer circuit of claim 2 wherein the pull transistor is turned off during transitions from the second voltage to the first voltage.

4. The buffer circuit of claim 2 wherein the second voltage is a value between the predesignated voltage and a power supply voltage of the power supply voltage terminal, the second voltage being different from the power supply voltage.

5. The buffer circuit of claim 2 wherein voltages between the first voltage and the predesignated voltage represent a first logic level and the voltages between the predesignated voltage and the second voltage represent a second logic level.

6. The buffer circuit of claim 5 wherein the predesignated voltage is a mid-level between a TTL high voltage and a TTL low voltage.

7. The buffer circuit of claim 1 wherein the buffer circuit is an output buffer circuit and the output terminal is coupled to an output pin of a dynamic random access memory.

8. The buffer circuit of claim 1 wherein the AND gate is part of a NAND gate, the second input terminal is an inverted input terminal, and the control terminal being coupled to the gate of the PMOS transistor.

9. A method for driving an output terminal of a buffer circuit, the method comprising:

(A) turning on a first circuit to cause the output terminal to make a transition from a first voltage to a second voltage, the first circuit including a first NMOS transistor coupled between a power supply terminal and the output terminal and a second NMOS transistor coupled between the output terminal and a ground terminal; and (B) turning on a feedback circuit to increase the rate of said transition during part of the transition when the output terminal moves from the first voltage to a predesignated voltage, the predesignated voltage being a value between but different from the first and second voltages, the feedback circuit having an AND gate with a first input terminal coupled to a buffer driver, a second input terminal coupled to the output terminal, and a control terminal coupled to a pull transistor, the pull transistor being coupled to pull the output terminal from the first voltage to the second voltage, the pull transistor being a PMOS transistor.

10. The method of claim 9 further comprising:

(C) turning off the feedback circuit when the signal reaches the predesignated voltage.

11. The method of claim 10 further comprising:

(D) turning off the feedback circuit during transitions from the second voltage to the first voltage.

12. The method of claim 10 wherein the buffer circuit is to be powered by a power supply voltage, and the second voltage is a value between the predesignated voltage and the power supply voltage, the second voltage being different from the power supply voltage.

13. The method of claim 12 further comprising:

(E) turning on the PMOS transistor when the output terminal starts to rise from the first voltage; and (F) turning off the PMOS transistor when the output terminal reaches the predesignated voltage.

14. The method of claim 13 wherein the buffer circuit is an output buffer circuit for driving an output pin in a dynamic random access memory.

15. The method of claim 13 wherein the AND gate is a NAND gate, the second input terminal is an inverted input terminal and the control terminal is coupled to the gate of the PMOS transistor.

16. The method of claim 10 wherein the voltages between the first voltage and the predesignated voltage represent a first logic level and the voltages between the predesignated voltage and the second voltage represent a second logic level.

17. The method of claim 16 wherein the predesigned voltage is the mid-level between a TTL high voltage and a TTL low voltage.

* * * * *